United States Patent [19]

Narasimhan et al.

[11] Patent Number: 5,094,711
[45] Date of Patent: Mar. 10, 1992

[54] PROCESS FOR PRODUCING SINGLE CRYSTAL TITANIUM CARBIDE WHISKERS

[75] Inventors: Krishnan Narasimhan, Southfield; Deepak G. Bhat, Troy, both of Mich.

[73] Assignee: GTE Valenite Corporation, Troy, Mich.

[21] Appl. No.: 242,582

[22] Filed: Sep. 12, 1988

[51] Int. Cl.$^5$ .............................. C01B 31/30
[52] U.S. Cl. ..................... 156/613; 156/DIG. 112
[58] Field of Search ............... 156/613, DIG. 112

[56] References Cited

U.S. PATENT DOCUMENTS

| | | | |
|---|---|---|---|
| 3,244,480 | 4/1966 | Johnson | 23/191 |
| 3,437,443 | 4/1969 | Hertl | 23/202 |
| 3,813,224 | 5/1974 | Hollander | 23/273 |
| 4,366,254 | 12/1982 | Rich et al. | 501/89 |
| 4,463,058 | 7/1984 | Hood et al. | 75/229 |
| 4,528,121 | 7/1985 | Matsushita et al. | 252/516 |
| 4,756,711 | 7/1988 | D'Angelo et al. | 156/610 |

OTHER PUBLICATIONS

Buljan, S. T. et al., *Ceramic Bulletin*, vol. 66, No. 2 (1987), $Si_3N_4$-SiC Composites, pp. 347-352.
Naito, K. et al., *J. Crystal Growth* 45, pp. 506-510 (1978).
Hamamura, K. et al., *J. Crystal Growth* 26, pp. 255-260 (1974).
Kato, A. et al., *J. Crystal Growth* 37, pp. 293-300 (1977).
Tamari, N. et al., *J. of Less Common Metals* 58, pp. 147-160 (1978).
Tamari, N. et al., *J. of Crystal Growth* 46, pp. 221-237, 1979.
Kato, A. et al., *J. of Crystal Growth* 49, pp. 199-203 (1980).
Wokulski, Z. et al., *Journal of Crystal Growth* 62, pp. 439-446 (1983).

*Primary Examiner*—Melvyn J. Andrews
*Attorney, Agent, or Firm*—Robert E. Walter

[57] ABSTRACT

A densified composite comprises an aluminum oxide matrix reinforced with titanium carbide whiskers of a preferred structure which whiskers are produced according to a process by selecting particular reaction conditions.

7 Claims, 2 Drawing Sheets

PROCESS FOR PRODUCING SINGLE CRYSTAL TITANIUM CARBIDE WHISKERS

FIELD OF THE INVENTION

The invention relates to fracture and abrasion resistant materials reinforced with refractory whisker material. More particularly, it is concerned with the utilization of whiskers having particular structural characteristics and a process for making those whiskers.

BACKGROUND OF THE INVENTION

In recent years, there has been an increasing need for composite materials having high fracture toughness, hardness and wear resistance for use in cutting tools, wear parts, and structural applications such as dies, turbines, nozzles, and the like. Due to their high modulus of elasticity, high hardness, and high strength, single crystal whiskers of such materials as silicon carbide have been utilized for such composites. For the cutting tool application, it is desirable that the composite have improved toughness, good strength at elevated temperatures and chemical inertness, and capable of operating at high cutting speeds.

Conventional ceramic cutting tool materials have failed to find wide application primarily due to the low fracture toughness. Ceramic materials are strong candidates but are inherently limited by this lack of fracture toughness when compared to cemented carbide cutting tools. The addition of whiskers to ceramic materials is known as a technique to improve the toughness of the ceramic composite. The advent of aluminum oxide based ceramics reinforced with silicon carbide whiskers has resulted in ceramic tools being utilized for machining hard, abrasive super alloys such as Inconel. However, prior art processes have not concentrated on matching the structural qualities of a particular type of whisker to a specific ceramic material to obtain an enhanced cutting tool. There is a need for cutting tool materials with improved toughness, chemical inertness, and a capacity to withstand high cutting speeds during machining operations.

SUMMARY OF THE INVENTION

The present invention is directed to a further improved and enhanced cutting tool wherein the whiskers are matched to the matrix material of the composite. To reduce the deleterious effects of temperature changes during cutting, the present invention selects the whisker material and the matrix material to minimize the difference between their respective coefficients of thermal expansion. Also, to obtain further desirable enhanced properties, the particular whisker and the matrix material are selected for chemical compatibility and desirable matching of the elastic moduli.

In the present invention, titanium carbide whiskers are utilized and alumina is the matrix material. In the case of titanium carbide whiskers, the expansion coefficient is close to alumina in comparison to silicon carbide. As a consequence, when the composite of whisker and matrix cools from hot pressing temperatures, the tendency to form deleterious stresses is desirably reduced. These micro-stresses may give rise to debonding, microcracking, and lowering of toughness. Unlike silicon carbide, titanium carbide is chemically inert toward steel. Even if titanium carbide whiskers react to form an oxide film at high temperatures, such a film is not as deleterious as the glassy spinel which may be formed when silicon carbide is used.

The present invention provides a densified composite comprising titanium carbide whiskers uniformly distributed in a a matrix material comprising aluminum oxide. The titanium carbide whiskers are single crystal whiskers with each whisker having a growth axis and a crystal structure having a plurality of crystal faces. At least a major portion of the whiskers in the composite have a predetermined growth axis and a predetermined crystal structure. The crystal structure has a plurality of crystal faces wherein at least one of said faces has a higher atomic density than the remaining faces. Preferably, at least a major portion of the whiskers have the higher atomic density face at an angle to the growth axis of the crystal. When such crystals are properly incorporated into the composite, there is a tendency to obtain enhanced toughness. Also, in accordance with the present invention, there is provided a process for preparing whiskers wherein the proportion of whiskers produced have the predetermined desired crystal orientation as set forth above. An improved furnace for carrying out the above process is also provided.

DETAILED DESCRIPTION OF THE PREFERRED EMBODIMENTS

Figure 1:
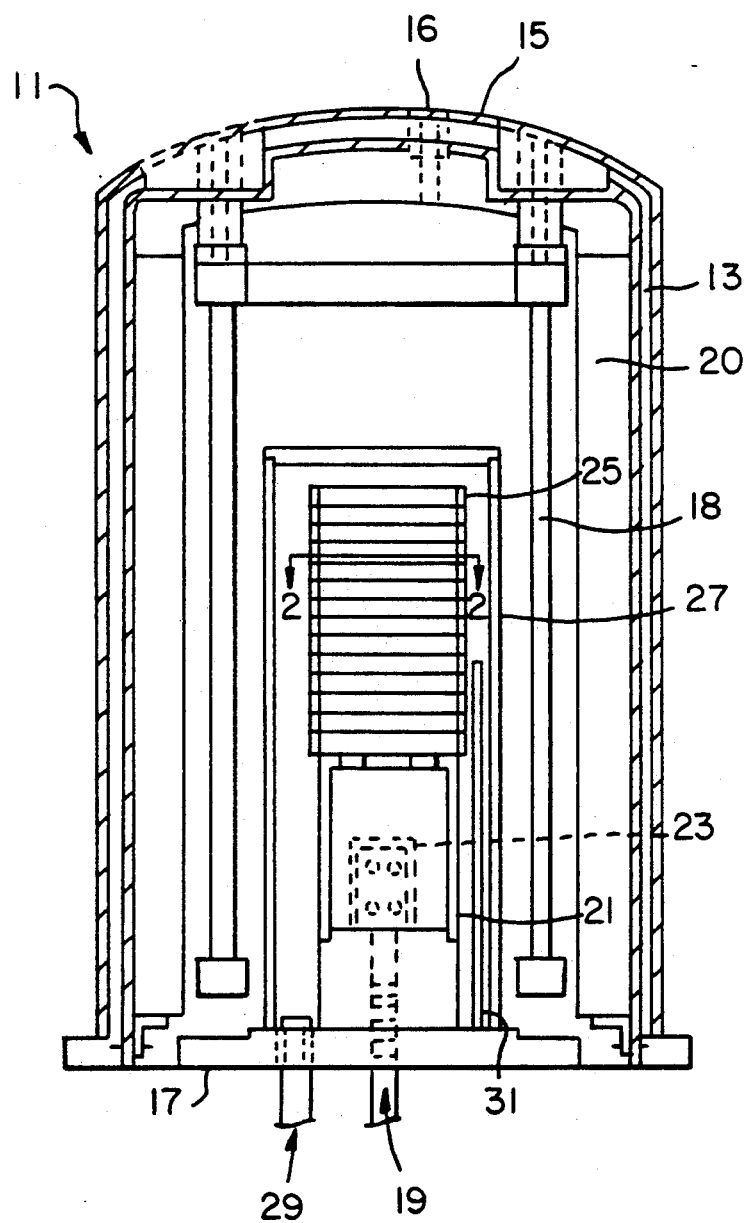
FIG. 1 illustrates a preferred reaction vessel of the present invention for use in the process of the present invention.

The densified composite of the present invention comprises titanium carbide whiskers uniformly distributed in a matrix material comprising aluminum oxide. The aluminum oxide matrix may include additional ingredients in the form of impurities and intentional additives provided such materials do not deleteriously affect the beneficial properties of the cutting tool. Generally such additional ingredients are present in the composite in an amount less than about 10 percent by weight and preferably less than about 7 percent by weight. Typical additions to the aluminum oxide matrix material include metal oxides, for example refractory metal oxides such as yttria and hafnium oxide, metal oxides such as magnesium oxide, calcium oxide, barium oxide, and other oxides such as silicon oxide. A preferred intentional additive includes zirconia which may undergo a phase change during processing of the matrix to impart desirable properties of toughness to the composite. Generally such additions of zirconia is less than about 5 percent by weight of the total composite.

The titanium carbide whiskers are preferably present in the matrix material in an amount sufficient to enhance the toughness of the matrix material. Preferably, the whiskers are present an range of from about 5% to about 60% by volume of the composite. The preferred range of refractory whiskers is from about 5% to about 40% by volume and more preferably the range is from about 10% to about 30% by volume. The composite possesses properties of a density greater than 98% of theoretical, more preferably greater than 99% of theoretical, high abrasion resistance, and high hardness. Due to the properties of improved toughness, good strength at elevated temperatures and chemical inertness, the composites of the present invention are preferably utilized as cutting tools.

The titanium carbide whiskers comprise single crystal having a longitudinal axis with preferred growth direction. The whiskers generally have an aspect ratio of length to diameter of about 5:1 to 500:1 and a diameter of about 0.5 to 10 microns. Typical whiskers have a multi-faceted crystal structure with various cross-sectional shapes and a defined growth axes. The typical growth axes for titanium carbide whiskers are the [100], [110], and [111]. Standard crystallagraphic nomenclature is used in reference to describing the titanium carbide whisker of the present invention. Generally the whiskers tend to fracture more easily along a direction parallel to a cleavage plane. With reference to the longitudinal axis of the whisker, it is desirable for the whisker to have a crystallographic orientation which maximizes fracture resistance.

The composite of the present invention may be prepared by techniques known in the art from a powder mixture of the matrix material and the whiskers. The starting materials may be processed to a powder compact of adequate grain strength by thoroughly mixing the matrix starting material and the whiskers by processes such as ultrasonic mixing and spray drying in a nonreactive liquid medium such as toluene or methanol; and forming the mixture for example by pressing, injection molding, extruding or slip casting. Processing may also optionally include a presintering or prereacting step in which either the noncompacted materials or the compact is heated at moderate temperatures.

In the preparation of cutting tools, the compact may be densified to a highly dense article by conventional techniques such as sintering, hot pressing, or hot isostatic pressing. Since the strength of the resulting cutting tool decreases with increasing porosity of the compact, it is important that the compact be densified to a density as closely approaching theoretical density as possible.

The whiskers are grown by the chemical vapor deposition process. According to a preferred arrangement, the gas mixture flows into the bottom of a vertically positioned reactor chamber and exits through a top outlet. The gases flow upward through the reaction chamber so as to maintain constant contact with the catalyst surface which promotes whisker growth. It is believed that the bottom feed of gases enhances laminar flow of the gaseous mixture through the reaction chamber.

The titanium carbide whiskers of the present invention are preferably produced in a cylindrical reaction vessel 11 of the type shown in FIG. 1. The furnace or reaction vessel 11 has generally vertical side walls 13, a top wall 15, and a bottom wall 17. A gaseous reaction mixture flowing through the inlet 19 exits the inlet 19 into the reaction zone 25 containing catalytic substrate surfaces. The gases may be preheated to a desired temperature prior to reaching the reaction zone.

The reaction zone 25 is formed by a plurality of stacked cylindrically walled fixtures. As illustrated in FIG. 1, the inlet 19 and reaction zone 25 are all confined within a partitioned area 27. Preferably the surfaces forming the partitioned area 27 are formed of graphite to aid in creating a carbon potential in the reaction vessel 11. The partitioned area 27 is in the form of a cylindrical wall having a flat top. Thus, the gaseous reaction mixture exiting through the upper end of the reaction zone 25 flows downward along the partitioned area 27 to exit via an outlet 29 in the bottom wall 17. Note that a thermocouple 31 is positioned in between the partitioned area 27 and the reaction zone 25 in the path of the exiting gases to aid in obtaining accurate temperature control.

Figure 3:
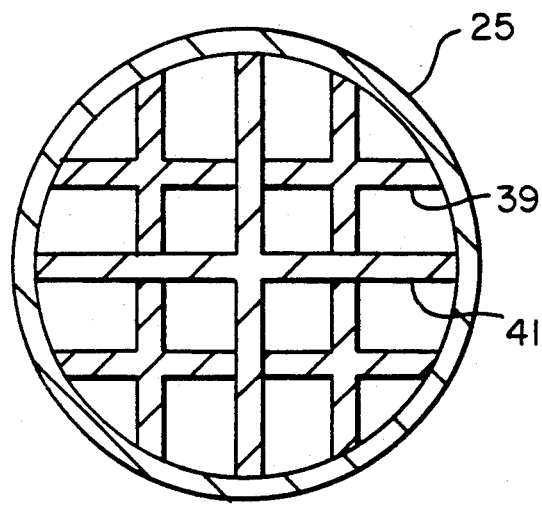
FIG. 3 illustrates the cross sectional view along section 2—2 of FIG. 1 of the reaction zone in the reaction vessel of the present invention.
Figure 2:
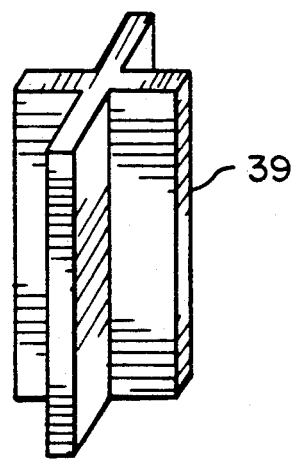
FIG. 2 illustrates a catalytic substrate surface for use in the reaction vessel.

According to the preferred construction of the reaction vessel 11, the fixtures have no bottom so that catalytic surfaces may be vertically aligned and positioned in the reaction zone 25 to promote the laminar flow of the gaseous reaction mixture. FIG. 2 illustrates the construction of a four vane catalytic substrate 39 which may be disposed in the reaction zone 25 in the manner shown in FIG. 3. To aid in creating a positive carbon potential in the reaction zone 25, it is preferable to have the cylindrically walled fixtures and partitions in the reaction zone 25 formed of graphite. Note that in FIG. 3, the reaction zone 25 is partitioned into a plurality of vertically aligned compartments 41 housing each vaned catalytic substrate 39. It is also contemplated that radially extending catalytic surface areas may be utilized provided provided the laminar flow of the upwardly rising gaseous reaction mixture is not unduly effected.

To promote a streamline axial flow of gaseous mixture through the reaction zone 25 and the fixtures located therein, a graphite foil may used to envelop the fixtures and prevent radial escape of gases. Openings are located along the outer periphery at the upper end of the enveloping graphite foil so the gaseous mixture flows into the furnace chamber and exits from the top of the reaction zone. It is believed that this construction increases the dwell time of the gaseous media and promotes laminar flow.

The catalytic substrate containing nickel is preferably arranged in the reactor in a manner promoting laminar flow of the gases. According to a preferred construction, reaction surfaces are placed parallel to the flow of the gaseous mixture. These structures include concentric cylinder screens and vertical vane structures. The vane structures may be arranged vertically to permit the gaseous mixture to flow along predetermined channels.

The surface area for whisker growth may be in the form of rods, cylinders, plates, screens or sheets. Preferably such surfaces are arranged with the area having the greatest cross section being parallel to the flow of gaseous reactants so as to promote laminar flow. Materials useful for the catalytic substrate surfaces for the growth of the titanium whiskers include nickel, high nickel metal alloys and other substrates such as graphite or cemented carbide which incorporate nickel. Suitable cemented carbide material includes tungsten carbide and other metal carbides in a metal matrix comprising nickel. Typical carbide substrates include GTE Valenite grades VC-320 and VC-83. One technique for incorporating nickel into a graphite substrate is by impregnating with an aqueous solution of a nickel salt. For example, Nickel may be impregnated into the substrate material by immersing the graphite in a nickel chloride solution.

Nickel screen is a preferred substrate material for producing uniform and smooth whiskers without branching. When nickel screens are utilized as a catalyst, it is preferable that a carbon source such as graphite be present adjacent the catalyst site. If graphite is the carbon source, it is preferred that the graphite be clean and porous to permit diffusion of carbon to the catalytic site to form whisker nuclei. It is believed that an appropriate balance exists between the carbon content in the substrate regions, and the gaseous reactants to promote whisker growth. If excess carbon is present on the catalytic substrate, whisker growth is undesirably hindered. Hence, it is believed that intentional deposition of carbon on a nickel catalyst should be avoided.

In accordance with the process of the present invention, titanium carbide whiskers are produced by flowing a gaseous reaction mixture over a heated catalytic substrate material at a suitable temperature in a reaction chamber comprising graphite for creating a carbon potential. The substrate comprises at least a catalytic amount of nickel for forming single crystal titanium carbide whiskers on catalytic substrate under conditions promoting the formation of crystals having desirable crystallographic orientation. The gaseous reaction mixture comprises methane, titanium chloride, hydrogen and an inert gas. The flow of the gaseous mixture has a laminar flow with respect to the substrate for a sufficient period of time to nucleate and grow titanium carbide whiskers on the catalytic substrate material surfaces.

In operation, the reactor is heated to the operating temperature and flushed with an inert gas. The temperature of operation of the furnace is about 1,000° to about 1,300° centigrade, and preferably at about 1,050° to about 1,200° centigrade. More preferably, the substrate temperature is from about 1100 to 1200 degrees Centigrade. When the catalytic substrate is nickel metal the preferred whisker formation temperature is from about 1120 to about 1150 degrees Centigrade.

To reduce adverse coarsening effects of whiskers, it is preferable to maintain the flow rate of the gaseous reaction mixture in the laminar flow regime. Preferably for reasonable yields of whiskers, the total flow rate of the gaseous reaction mixture through the reactor is less than about 140 to 175 liter per minute for the reactor as previously described. With larger reactors, higher flow rates are permissible without affecting the nature of the gaseous flow. It is believed that higher velocities of gases promote coatings while lower velocities promote whisker growth.

It is believed that the mass transport of atoms at the reaction site plays an important role in whisker growth. At higher velocities, the effective residence time to Ti atoms and C atoms to form solid nuclei for whisker growth at the absorbed surface is lowered and consequently nucleation is hampered.

The gaseous reaction mixture comprises methane, titanium chloride, hydrogen and an inert gas. Preferably, the concentration of titanium chloride in volume percent of the incoming gaseous reaction mixture is from about 0.2 to about 5 volume percent and preferably from about 0.3 to about 2 volume percent. The yield or growth rate of whiskers assume a maximum at a certain molar ratio of $CH_4/TiCl_4$ which corresponds to the carbon to titanium (C/Ti) atomic ratio herein referred to. When a nickel metal or a nickel metal alloy consisting essentially of nickel is used as the catalytic substrate, the C/Ti atomic ratio is preferably from about 0.5 to about 2.5 depending on the substrate utilized. The preferred ratio of C/Ti is about 0.8. It is believed that at higher C/Ti ratios excess free carbon impedes whisker growth. The volume ratio of methane to hydrogen ($CH_4/H_2$) may be varied within a wide range. Generally the ratio of $CH_4/H_2$ is from 1:15 to 1:40; preferably from at least 1:20 to 1:40, and more preferably in the range of 1:25 to about 1:35. At the lower ratios, whisker formation is desirably promoted while at higher ratios, the presence of excess methane may undesirably increase the tendency to form free carbon. An inert gas is incorporated into the gaseous reaction mixture to enhance heat transfer in the reaction zone at deposition temperatures. Preferably, the inert gas is present in an amount from about 16 to about 25 percent of the total volume of the gaseous reaction mixture. More preferably, the inert gas is argon.

The duration of deposition for whisker growth influences the length and to a lesser extent the diameter of whiskers. According to a preferred process, the flow of gaseous mixture is intermittent. Deposition times of from about 40 minutes to about 180 minutes interrupted by the flow of an inert gas for a period of 5 minutes to about 15 minutes are preferred. Each layer of the whisker bed nucleates on the previously formed layer during deposition. Bed thicknesses are in the range of 5 to 10 microns. With the interrupted cycle, undesirable branching of the whiskers is decreased. Each process cycle segment has a separate layer of whiskers growing from the initial bed. The whiskers produced by interrupted cycles are more easily stripped from the nickel screen as compared to a continuous cycle where the whiskers are more adherent to the substrate. An improved yield was achieved with the interrupted cycles.

The whiskers grown on nickel screen substrates reveal more of octagonal cross-sections, than the whiskers grown on nickel chloride impregnated graphite substrates. The merit of using pure nickel catalytic screens manifests in certain specific growth axes of whiskers wherein the easy slip system (111), [110] is avoided. Thus, when a crack encounters a TiC whisker in the composite favorable slip planes are not presented for the crack to propagate. This would cause the crack to deflect around the whisker causing a toughening of the composite. This advantage cannot be realized when whisker growth axis is of [111] type.

The toughness of a whisker is dependent on its elastic modulus and integrity of the single crystal. Impurity atoms decrease the elastic modulus of a whisker when present in substantial quantities. The whiskers of the present invention which consist essentially of titanium carbide are sub-stoichiometric within the range of $TiC_{0.85}$ to $TiC_{0.95}$ and are characterized by the absence of deleterious impurities, such as Fe, Ni, Cr and oxygen.

The present invention provides a method for producing high quality single crystal titanium carbide whiskers, which when incorporated in ceramic materials, are expected to provide composite materials having increased fracture toughness, hardness, and wear resistance for such applications as cutting tools.

EXAMPLE 1

The reactor is illustrated in FIG. 1 and as previously described is utilized in the present example. The gaseous mixture flows upwardly through the reaction chamber so as to contact the catalyst and deposit the whiskers thereon. Graphite trays in the form of cylindrical fixtures surround the catalytic substrate and are stacked vertically. Sidewalls permit stacking of the trays with each tray resting on an adjacent tray in spaced relationship. To promote unidirectional flow, a graphite foil is used to envelop the trays. The gaseous mixture comprises methane, titanium chloride, hydrogen and argon. The flow rate of the gaseous reaction mixture into the reactor is about 147 liters per minute. Argon is present at 20 percent by volume. Titanium chloride is utilized at the rate of about 2 liters per minute. The volume ratio of methane to hydrogen is 1:25. The ratio of CH4/TiCl4 (atomic ratio C/Ti) is about 0.8. The substrate is maintained at a temperature of about 1135 to 1150 degrees Centigrade by furnace controls. The whiskers grown on the substantially pure nickel catalytic screen have a predominently rectangular cross-section with a growth direction of [112].

EXAMPLE 2

Approximately 11 to 15 volume percent of the TiC whiskers produced according to Example 1 were blended with premilled alumina in a ball mill with Naphtha as a liquid medium for about 15 to 30 minutes. The resulting mixture was dried, screened, cold pressed and hot pressed at 1677 degrees Centigrade for 30 minutes at 4500 psi. The sintered article was ground and shaped into an SNG433 insert for machining performance study. The insert exhibited good tool life in cutting 4150 steel.

While there has been shown and described what are at present considered the preferred embodiments of the invention, it will be obvious to those skilled in the art that various changes and modifications can be made therein without departing from the scope of the invention as defined by the appended claims.

We claim:

1. A process for producing single crystal titanium carbide whiskers comprising the steps of flowing a gaseous reaction mixture through a reaction chamber containing a heated catalytic substrate material, said catalytic substrate material being a substantially pure nickel metal screen, a source of carbon being positioned in the path of said flowing gaseous reaction mixture for creating a carbon potential for enhancing the propensity of said mixture to form whiskers on said substrate under conditions promoting the formation of single crystal titanium carbide whiskers having a higher atomic density at a crystal face wherein said face of higher atomic density is at an angle to the growth axis of said crystals, said gaseous mixture comprising methane, titanium chloride, hydrogen and an inert gas wherein said conditions comprising maintaining the concentration of titanium chloride from about 0.2 to about 5 volume percent of the gaseous mixture, the atomic ratio of carbon to titanium from about 0.5 to about 2.5, and the volume ratio of methane to hydrogen from about 1:15 to about 1:40, wherein the flow of said gaseous mixture has a laminar flow with respect to said substrate, for a sufficient period of time to nucleate and grow said single crystal titanium carbide whiskers having said higher atomic density on said substrate material surfaces.

2. A process for producing titanium carbide whiskers according to claim 1 wherein the volume ratio of methane to hydrogen is from about 1:20 to about 1:40.

3. A process for producing titanium carbide whiskers according to claim 2 wherein the atomic ratio of carbon to titanium is from about 0.8 to 2.0.

4. A process for producing titanium carbide whiskers according to claim 2 wherein the concentration of titanium chloride is from about 0.35 to about 2.5 volume percent of the gaseous mixture.

5. A process for producing titanium carbide whiskers according to claim 3 wherein said substrate comprises nickel or a metal alloy comprising nickel.

6. A process for producing titanium carbide whiskers according to claim 5 wherein a major proportion of single crystal titanium carbide whiskers having said higher atomic density.

7. A process for producing titanium carbide whiskers according to claim 6 wherein wherein said major proportion of single crystal titanium carbide whiskers have a rectangular cross-section with a growth direction of 112.

* * * * *